(12) United States Patent
Iwafuchi

(10) Patent No.: US 7,289,089 B2
(45) Date of Patent: Oct. 30, 2007

(54) LIGHT EMITTING UNIT

(75) Inventor: Toshiaki Iwafuchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 123 days.

(21) Appl. No.: 10/211,736

(22) Filed: Aug. 2, 2002

(65) Prior Publication Data

US 2003/0025657 A1 Feb. 6, 2003

(30) Foreign Application Priority Data

Aug. 3, 2001 (JP) ............................ P2001-235793

(51) Int. Cl.
*G09G 3/32* (2006.01)
*G06F 3/38* (2006.01)
(52) U.S. Cl. ........................... 345/82; 345/204; 257/88
(58) Field of Classification Search .......... 345/30–103, 345/204–206; 257/72–89
See application file for complete search history.

(56) References Cited

U.S. PATENT DOCUMENTS

| | | | | |
|---|---|---|---|---|
| 3,947,840 A | * | 3/1976 | Craford et al. ................ 345/82 |
| 4,039,890 A | * | 8/1977 | Bailey et al. ................. 345/82 |
| 5,699,073 A | * | 12/1997 | Lebby et al. ................. 345/82 |
| 5,739,800 A | * | 4/1998 | Lebby et al. ................. 345/82 |
| 5,818,404 A | * | 10/1998 | Lebby et al. ................. 345/82 |
| 5,821,571 A | * | 10/1998 | Lebby et al. ................. 257/98 |
| 6,498,592 B1 | * | 12/2002 | Matthies ..................... 345/84 |
| 6,633,134 B1 | * | 10/2003 | Kondo et al. ............. 315/169.3 |
| 2001/0032985 A1 | * | 10/2001 | Bhat et al. .................... 257/88 |

FOREIGN PATENT DOCUMENTS

JP 2001-067238 3/2001

\* cited by examiner

*Primary Examiner*—David L. Lewis
(74) *Attorney, Agent, or Firm*—Bell, Boyd & Lloyd LLP

(57) ABSTRACT

A light emitting unit represented by an image display unit includes chips, each of which is formed by burying a light emitting device such as a GaN based semiconductor light emitting device in a resin, wherein external terminals connected to the light emitting device buried in each chip are provided on the chip, and a drive control device such as a pixel transistor for controlling the drive of the light emitting device are connected to the external terminals in a state being at least partially overlapped to the chip. Such an image display unit is advantageous in improving a device density such as a pixel density, enhancing the connection reliability by increasing the diameters of via-holes for wiring without excessively reducing the size of each chip, improving the fabrication yield, facilitating the handling of the chip (or device) at the time of bonding by increasing the apparent area of the chip (or device), and lowering the required specification in terms of alignment accuracy of the chip (or device).

31 Claims, 13 Drawing Sheets

LIGHT EMITTING UNIT

BACKGROUND OF THE INVENTION

The present invention relates to a light emitting unit suitable as an image display unit or the like.

Light emitting diodes (LEDs) have been used as pixels of a light emitting unit such as an image display unit or a light source unit.

FIG. 10 shows a related art image display unit 10 of this type, wherein LED modules 2 are two-dimensionally arrayed on and fixed to a base body 1, and an anode electrode 3 and a cathode electrode 4 of each of the LED modules 2 are connected to wiring lines on the base body 1 by wire bonding or soldering.

The image display unit 10 has a screen including, for example, several hundreds of thousand pixels, wherein each of LED chips cut off from a wafer is used as the LED module 2 constituting one pixel. Such an image display unit 10, however, fails to increase the module density per unit area because of a large occupied area of the LED modules 2.

FIG. 11 is a plan view showing an essential portion of the image display unit 10, wherein the three kinds of LED modules 2 (for example, the LED module 2R for emission of red light, the LED module 2G for emission of green light, and the LED module 2B for emission of blue light) are arrayed on a plane of the base body 1, and a pixel transistor 5 for controlling the drive of the LED modules 2R, 2G, and 2B is fixedly connected to a position, apart from the LED modules 2R, 2G, and 2B, of the same plane of the base body 1. The pixel transistor 5 supplies specific control signals to the LED modules 2R, 2G, and 2B via wiring lines 6 and 7 (including wire bonding portions). Such a configuration of the image display unit 10 has an inconvenience that the pixel density cannot be increased due to not only the occupied area of the LED modules 2 but also the occupied area of the pixel transistor 5. Even if the pixel transistor 4 is disposed at the periphery of an image region, there is a limitation to improvement of the pixel density because of provision of a wiring region or the like.

To cope with such an inconvenience of the related art image display unit shown in FIG. 10, the resent applicant has already proposed, in Japanese Patent Application No. 2001-67238, a display unit capable of reducing an occupied area of semiconductor light emitting devices per unit area, simplifying wiring, and significantly reducing the fabrication cost.

This display unit according to the invention described in the earlier application (hereinafter, referred to as "earlier invention") has a structure, for example, as shown in FIG. 12. Referring to FIG. 12, GaN based semiconductor light emitting devices 11, each of which is buried in a first insulating layer 21 made from epoxy region, are arrayed with a specific pitch on a plane of a transparent base body 31 taken as a display panel. In this case, each of the semiconductor light emitting devices 11 is fixed between connection electrodes 32 provided on the upper surface of the base body 31 via a transparent adhesive 33, and an epoxy region solution is applied to cover the overall surfaces of the semiconductor light emitting devices 11 and dried and heated to be cured, to form a second insulating layer 34 made from epoxy region.

In such a state, a connection hole 35 reaching an extraction electrode 18d of each semiconductor light emitting device 11 and a connection hole 36 reaching a connection electrode 32 on the upper surface of the base body 31 are formed in the second insulating layer 34, and a connection hole 37 reaching an extraction electrode 19d of the semiconductor light emitting device 11 is formed in the second insulating layer 34. After that, an aluminum layer is formed over the second insulating layer 34 so as to bury the holes 35, 36, and 37 by a vapor-deposition process of a sputtering process and is patterned by photolithography to form a conductive layer 38 part of which buries the connection holes 35 and 36 and a conductive layer 39, part of which buries the connection hole 37. As a result, a p-side electrode 18 (described later) of the semiconductor light emitting device 11 is connected to the connection electrode 32 on the base body 31 via the conductive layer 38 and is further connected to a drive control circuit, while an n-side electrode 19 (described later) of the semiconductor light emitting device 11 is led to the upper surface of the second insulating layer 34 via the conductive layer 39 and is further connected to another drive control circuit.

In this way, according to the display unit described in the earlier invention, the semiconductor light emitting devices 11, each of which is buried in the first insulating layer 21, are fixedly arrayed with a specific pitch on the plane of the base body 31 taken as a panel plane and covered with the second insulating layer 34, and the electrodes 18d and 19d of each of the semiconductor light emitting devices 11 are extracted via the conductive layers 38 and 39. As a result, it is possible to reduce the occupied area of the semiconductor light emitting devices per unit area of the display unit, simplify the wiring, and significantly reduce the fabrication cost.

Another advantage of the display unit described in the earlier invention is that since the GaN based semiconductor light emitting device 11 having a microsize is buried in the first insulating layer 21, to form a chip having a large apparent size, the handling of the light emitting device 11 can be facilitated. In addition, since the extraction electrodes 18d and 19d each having a relatively large area can be provided on the upper surface of the chip, that is, on the upper surface of the first insulating layer 21, it is easier to extract the electrodes to the second insulating layer 34 side.

The fabrication of each GaN based semiconductor light emitting device 11 used for the display unit described in the earlier invention will be described below.

FIGS. 13A and 13B are a sectional view and a plan view, respectively, showing a structure of the GaN based semiconductor light emitting device 11.

A buffer layer made from Al or GaN is formed on a (0001) plane of a sapphire substrate (not shown) at 500, and an n-type silicon-doped gallium nitride (GaN:Si) layer 12 is flatly grown thereon at 1000. A mask 13 made from $SiO_2$ or SiN having an opening is formed on the silicon-doped GaN layer 12, and a hexagonal pyramid shaped n-type semiconductor (GaN:Si) layer 14 is formed by crystal growth of n-type silicon doped gallium nitride from the opening of the mask 13 at 1000° C.

An active layer 15 made from InGaN is formed on a (1-101) plane or a plane equivalent thereto of the hexagonal pyramid shape of the n-type semiconductor layer 14 at a growth temperature lower than 1000°, and a p-type magnesium-doped gallium nitride (GaN:Mg) 16 is grown on the active layer 15. A p-side electrode 18 made from Ni/Au, serving as a reflection plane from which light emitted from the active layer 15 is to be reflected, is formed on the p-type (GaN:Mg) layer 16 by vapor-deposition. Meanwhile, an opening is formed in the mask 13 on the flat under growth layer 12, and an n-side electrode 19 made from Ti/Au is formed on the under growth layer 12 through the opening formed in the mask 13 by vapor-deposition.

The semiconductor light emitting devices 11 thus formed are peeled from the sapphire substrate and are buried in a first insulating layer 21 (see FIG. 12) provided on a support body, and are peeled from the support body and transferred to a transparent support body. Extraction electrodes 18*d* and 19*d* (see FIG. 12) are then formed for each of the semiconductor light emitting devices 11. The first insulating layer 21 is diced into chips 40 each having a specific size. The dicing is made such that the semiconductor light emitting device 11 is located at an approximately central portion of the chip 40. Each chip 40 is irradiated with laser beams traveling from the back side of the transparent support body, to deteriorate the adhesive, thereby peeling the chip 40 from the transparent support body.

As shown in FIG. 12, the chips 40 are fixed to the transparent base body 31 and the second insulating layer 34 is formed to cover the chips 40, followed by the steps described above, to fabricate a display unit 41 shown in FIG. 12. It is to be noted that the semiconductor light emitting device 11 described above is configured as an LED but may be a semiconductor laser or the like (the same is true in the following description).

The extraction electrodes 18*d* and 19*d*, provided on each chip 40 having a large apparent size in which the semiconductor light emitting device 11 is buried, are connected to drive circuits. When a current is injected to each semiconductor light emitting device 11 of the display unit, the light emitting device 11 emits light rays 30 to the under growth layer 12 side or the transparent substrate 31 side.

The material of the semiconductor light emitting device 11 is not particularly limited insofar as it allows recombination of positive holes and electrons as carriers for light emission when a current is injected in the normal direction to a junction plane between the p-type semiconductor and the n-type semiconductor. The material may be a known semiconductor, examples of which include gallium based compound semiconductors such as gallium nitride (GaN) for emission of blue light, gallium phosphide (Gap) for emission of green light, gallium arsenic phosphide (GaAsp) for emission of red light, and aluminum gallium arsenide (AlGaAs), zinc selenide (ZnSe) and silicon carbide (SiC).

A compound semiconductor layer as part of the semiconductor light emitting device can be formed by an MOCVD (Metal-Organic Chemical Vapor Deposition) process, an MBE (Molecular Beam Epitaxy) process, or an HVpE (Hydride Vapor-phase Epitaxy) process. The size of the semiconductor light emitting device may be made as small as possible insofar as the device is handleable. Such a micro-sized semiconductor light emitting device can be easily obtained by a method of forming a compound semiconductor by selective crystal growth on a sapphire substrate as compared with a method of dicing a wafer made from a compound semiconductor into chips. A semiconductor light emitting device with its size of one side of a lower end surface being in a range of about 100 to 200 m or less (for example, about 10 to 50 m) can be obtained by such selective crystal growth. The device obtained by selective crystal growth may be subjected to additional processing for adjusting a three-dimensional shape.

In such a micro-sized semiconductor light emitting device formed by selective crystal growth, a p-side electrode made from, for example, Ni/Au is formed on the p-type semiconductor by vapor-deposition and an n-side electrode made from Ti/Au is formed on the n-type semiconductor by vapor-deposition. Each micro-sized semiconductor light emitting device provided with these electrodes may be fixedly arrayed on the surface of a base body as it is.

However, the semiconductor light emitting device formed into a significantly micro-shape is, as described above, covered with a first insulating layer to form a chip having a large apparent size. This is advantageous in facilitating the handling of the semiconductor light emitting device.

Each semiconductor light emitting device 11 fixedly arrayed on a transparent base body is allowed to improve the luminance of emission light to the base body plane side; that is, the lower end surface side of the semiconductor light emitting device depending on the shape thereof. Of light emitted from a light emission region (active layer) of the semiconductor light emitting device 11, a light component traveling upwardly from the light emission region is reflected from an electrode plane taken as a reflection plane of the upper end portion to the lower end surface side. However, a light component traveling to a side surface perpendicular to the lower end surface less travels to the lower end surface side even if being reflected from the side surface. In this regard, it is desired for the semiconductor light emitting device 11 to have a tilt plane tilted from the lower end surface at an angle in a range of 45±20°. By providing a reflection plane on such a tilt plane, the light component traveling to the side surface can be effectively reflected therefrom to the lower end surface side.

The tile plane may be a one-side tilt plane, a both-side tilt plane, or a square tilt plane. With respect to reflection of emission light, the semiconductor light emitting device preferably has a pyramid shape or a truncated pyramid shape. In particular, for the semiconductor light emitting device having a truncated pyramid shape, such as a polygonal truncated pyramid shape, the upper surface can be taken as a reflection plane, whereby light emitted from the active layer can be more effectively directed to the lower end surface side. The term "pyramid shape" includes a triangular pyramid shape, a square pyramid shape, a pentagonal pyramid shape, a hexagonal pyramid shape, and a polygonal pyramid shape close to a cone, and the term "truncated pyramid shape" includes truncated pyramid shapes corresponding to the above-described various pyramid shape.

The material used for each of the insulating layers such as the first insulating layer 21 and the second insulating layer 34 may be either an organic material or an inorganic material, with the kind and formation method thereof being particularly limited. In the case of using $SiO_2$ or $Si_3O_4$ as an inorganic material, it may be formed by a CVD (Chemical Vapor Deposition) process or a sputtering process. In the case of using a polymer compound such as epoxy resin, polyimide resin, or synthetic rubber as an organic material, it can be easily formed even on a base body having a large area by a simple coating process, thereby reducing the cost of a display unit. As an insulating layer formed by coating, a glass film coated by a spin-on-glass process is usable.

The display unit described in the earlier invention having the above-described advantages, however, has a problem to be improved.

In the display unit described in the earlier invention, a pixel transistor (not shown, which is equivalent to the transistor 5 shown in FIG. 11) for controlling the drive of the chips (LIP) 40 in each of which the semiconductor light emitting device 11 is buried is disposed on the base body 31 at a position, apart from the chips 40, on the same plane as that on which the chips 40 are disposed, so that as described above, the pixel density cannot be increased so much due to the occupied area of the pixel transistor. Even if the pixel transistor is disposed at the periphery of an image region, there is a limitation to improvement of the pixel density because of provision of a wiring region or the like.

Another disadvantage of the display unit described in the earlier invention is that since there is a limitation to the area of a panel (area of an image portion) of the display unit, the size of each chip 40 must be reduced due to the occupied area of the pixel transistor. Accordingly, the diameters of the connection holes 35 and 37 (via-holes) become small, to cause inconveniences that alignment accuracy must be increased at the time of bonding each chip or device, and that a stress produced by thermal expansion or contraction of the insulating layers 21 and 34 causes strains of the connection holes (via-holes) 35 and 37, which may possibly lead to disconnection.

SUMMARY OF THE INVENTION

An object of the present invention is to provide a light emitting unit ensuring advantages comparable to those of the display unit described in the earlier invention with a structure different therefrom, and further improving the device density such as a pixel density, enhancing the connection reliability by increasing the diameter of a via-hole for wiring without excessively reducing the size of each chip, facilitating the handling of each chip at the time of bonding by increasing the apparent area of each chip (or device), reducing the required specification in terms of alignment accuracy of each chip (or device), and to provide a double-side light emitting unit being easier for each chip (or device) and a drive control device such as a pixel transistor to be arrayed.

To achieve the above object, according to a first embodiment of the present invention, there is provided a light emitting unit (hereinafter, referred to as "first light emitting unit of the present invention") including: a chip in which a light emitting device is buried; and a drive control device for controlling the drive of the light emitting device; wherein an external terminal connected to the light emitting device is provided on the chip, and the drive control device is connected to the external terminal in a state being at least partially overlapped to the chip.

According to the first light emitting unit of the present invention, since the chip in which the light emitting device is buried and the drive control device are at least partially overlapped to each other, they can be three-dimensionally disposed. Accordingly, it is possible to increase the diameter of a via-hole for wiring by increasing the apparent size of the chip (or device) and, hence, to enhance the connection reliability and improve the fabrication yield. It is also possible to facilitate the handling of the chip (or device), for example, at the time of bonding the chip (or device) by increasing the apparent area of the chip (or device) and improve the bonding rate and, hence, to improve the fabrication yield and reduce the required specification in terms of alignment accuracy of the chip (or device).

Since the light emitting device buried in the chip is connected to the external terminal provided on the chip, and the drive control device is connected to the external terminal, it is possible to reduce the area of the light emitting device, simplify the wiring, and significantly reduce the fabrication cost.

Since the micro-sized light emitting device is buried in the resin, to form the chip having a large apparent size, it is possible to facilitate the handling of the light emitting device.

According to a second embodiment of the present invention, there is provided a light emitting unit (hereinafter, referred to as "second light emitting unit of the present invention") including: a chip in which a light emitting device is buried; and a drive control device for controlling the drive of the light emitting device, the drive control device being smaller than the chip; wherein an external terminal connected to the light emitting device is provided on the chip; the drive control device is fixed on an insulating layer at a position within a region, on which the chip is thrown, of the insulating layer; and the external terminal of the chip and the drive control device are connected to an electrode terminal provided on the insulating layer.

According to the second light emitting unit of the present invention, since the drive control device, having a size smaller than that of the chip in which the light emitting device is buried, is fixed to the insulating layer at a position within a region, on which the chip is thrown, of the insulating layer, the chip and the drive control device can be three-dimensionally disposed. Accordingly, like the first light emitting unit of the present invention, it is possible to increase the diameter of a via-hole for wiring by increasing the apparent size of the chip (or device) and, hence, to enhance the connection reliability and improve the fabrication yield. It is also possible to facilitate the handling of the chip (or device), for example, at the time of bonding the chip (or device) by increasing the apparent area of the chip (or device) and improve the bonding rate and, hence, to improve the fabrication yield and reduce the required specification in terms of alignment accuracy of the chip (or device).

Since the external terminal provided on the chip in which the semiconductor light emitting device is buried and the drive control device are connected to the electrode terminal provided on the insulating layer, it is possible to reduce the occupied area of the light emitting device, simplify the wiring, and significantly lower the fabrication costs. Since the drive control device has a micro-size, light emitted from the light emitting device can be emerged not only from the chip side but also from the insulating layer side, with a result that it is possible to provide a double-side imaging display unit having image display planes on both sides, which display unit is desirable in terms of easy tiling.

Since the micro-sized light emitting device is buried in the resin, to form the chip having a large apparent size, it is possible to facilitate the handling of the light emitting device.

In the first light emitting unit of the present invention, the drive control device may be overlapped face-up or face-down to the chip.

The drive control device may be fixed on a substrate, and the chip be fixedly connected onto the chip. With this configuration, light emitted from the light emitting device can be emerged from the chip side, and thereby the chip side can be taken as an image display plane and the chip is easier to be repaired.

Alternatively, the chip may be fixed on a substrate, and the drive control device may be fixedly connected onto the chip. With this configuration, light emitted from the light emitting device can be emerged from the substrate side, whereby the substrate side can be taken as an image display plane. In this case, the substrate may be made from a material having light transmissivity.

According to the second light emitting unit of the present invention, the light emitting device and the drive control device may be located at positions not overlapped to each other. With this configuration, by forming the insulating layer made from a material having light transmissivity, light emitted from the light emitting device can be emerged from both the chip side and the insulating layer side (particularly, on the drive circuit board side), and the positioning between the chip and the drive control device and the tiling of the chip and the drive control device can be facilitated.

In this case, the drive control device may be fixed to the insulating layer at a position different from a position at which the external terminal of the chip is connected to the electrode terminal, and the drive control device may be connected to the electrode terminal via a conductor such as a wire.

The drive control device may be fixed to the insulating layer, and the chip be disposed above the drive control device. With this configuration, the chip is easier to be repaired. Alternatively, the chip may be fixed to the insulating layer, and the drive control device may be disposed above the chip.

According to each of the first and second light emitting units of the present invention, at least a side surface of the drive control device or the chip may be covered with an insulating layer, and wiring connected to the drive control device or the chip may extend on the insulating layer.

In the case of using light emitting devices for emission of light of different colors, a number of chips in which the light emitting devices are respectively buried may be disposed side by side or stacked to each other in a state being overlapped to the drive control device and are connected to the drive control device. With this configuration, the number of chips can be disposed without occurrence of any positional deviation thereof. This configuration is particularly suitable for a multi-color or full color image display.

The light emitting device may be a semiconductor light emitting device such as an LED or a semiconductor laser made from a gallium nitride based semiconductor or the like, and may be buried in a resin having light transmissivity.

Each of the first and second light emitting units of the present invention can be configured as an image display unit or a light source unit.

Additional features and advantages of the present invention are described in, and will be apparent from, the following Detailed Description of the Invention and the Figures.

DETAILED DESCRIPTION OF THE INVENTION

First Embodiment

A light emitting unit represented by a display unit according to a first embodiment will be described with reference to FIGS. 1 to 5B.

Figure 1:
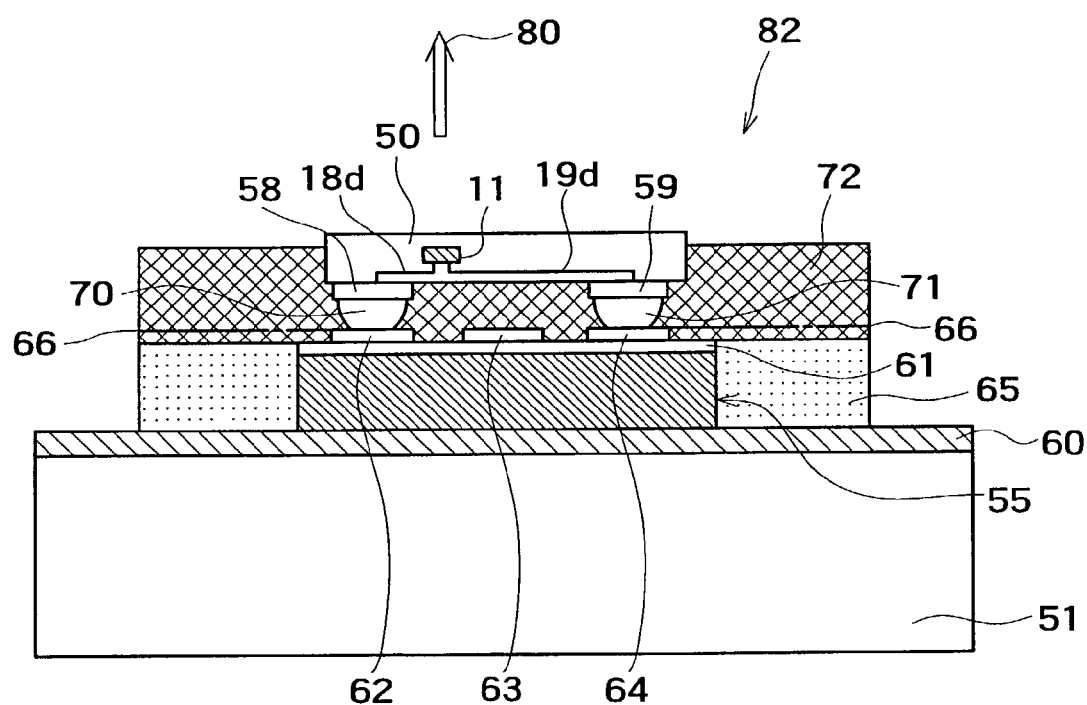
FIG. 1 is a sectional view, taken on line I-I of FIG. 2, showing an essential portion of a display unit according to a first embodiment of the present invention.
Figure 2:
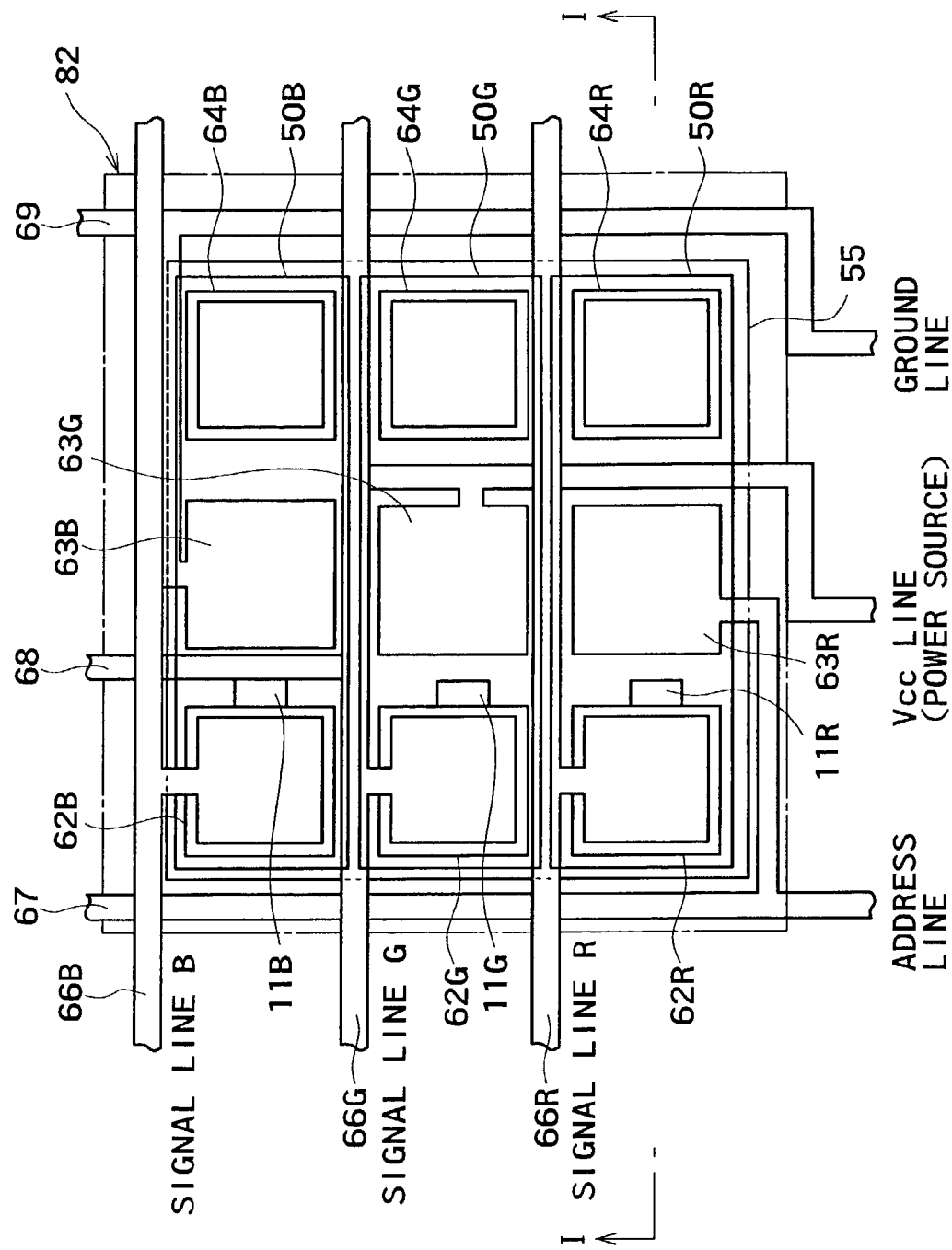
FIG. 2 is a plan view of an essential portion of the display unit according to the first embodiment.

As shown in FIG. 1, a drive transistor 55 for pixel control is mounted face-up on a drive circuit board or wiring board 51 made from glass or plastic by die-bonding using a die bonding material 60. An insulating layer 61 is formed on the drive transistor 55, followed by stacked wiring, to form pads 62, 63 and 64. These pads 62, 63 and 64 are formed for re-wiring and are, as shown in FIG. 2, taken as a pad 62 for a signal line (p-side electrode), a pad 63 for an address line, a power source line, or a ground line, and a pad 64 for an n-side electrode, respectively. An insulating layer 65 is formed so as to surround the transistor 55, with wiring lines 66, 67, 68, and 69 being formed on the insulating layer 65. These lines 66, 67, 68, and 69 extend from the pads 62 and 63 of each of a number of the transistors 55 for connecting the number of transistors 55 to each other.

A resin-covered chip 50 formed by burying a semiconductor light emitting device (LED) 11 in a resin is mounted face-down on the drive transistor 55 in such a manner as to be overlapped thereto. At this time, bumps 70 and 71 previously formed on the chip 50 are connected to the pads 62 and 64 of the drive transistor 55 by ACF (Anisotropic Conductive Film) connection or ultrasonic bonding, respectively. After connection with the drive transistor 55, the chip 50 may be sealed with an under fill material 72.

In the above sealing step, the chip 50 disposed on the drive transistor 55 can be easily inspected and repaired before it is filled with the under fill material 72. Namely, after the chip 50 is temporarily bonded to the drive transistor 55, a current is supplied from the drive transistor 55 to the semiconductor light emitting device 11 buried in the chip 50, to check whether or not the semiconductor light emitting device 11 emits light rays 80, and if it is decided that the chip 50 is defective, the defective chip 50 can be repaired before the chip 50 is filled with the under fill material 72.

FIG. 2 shows a full-color display unit including light emitting devices each having the same configuration as that of the semiconductor light emitting device 11 shown in FIG. 1. In this display unit, resin-covered chips 50R, 50G, and 50B are mounted side by side on the same plane of a common drive transistor 55 for pixel control. A semiconductor light emitting device 11R for emission of red light (R) is buried in the resin-covered chip 50R, a semiconductor light emitting device 11G for emission of green light (G) is buried in the resin-covered chip 50G, and a semiconductor light emitting device 11B for emission of blue light (B) is buried in the resin-covered chip 50B.

Figure 3:
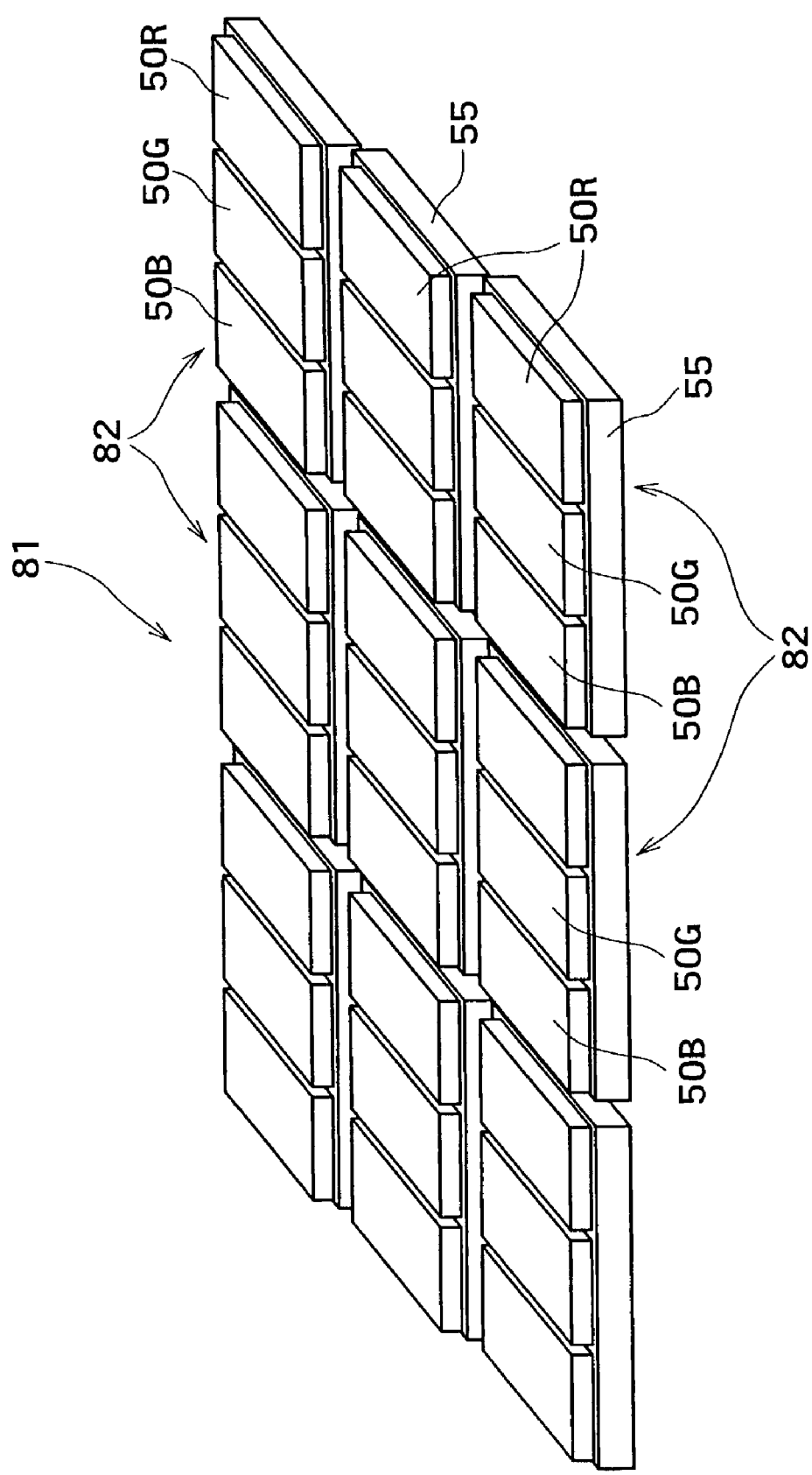
FIG. 3 is a schematic perspective view the display unit (display panel) according to the first embodiment.

FIG. 3 shows an image display unit 81 formed by arraying a number of light emitting units 82, each of which has the same configuration as that of the resin-covered chip shown in FIGS. 1 and 2, in a matrix on a common board (not shown). In FIG. 3, the above-described insulating layer 65, the under fill material 72, and the like, are omitted.

The above-described resin-covered chip 50 (hereinafter, referred to as "LIP 50") can be fabricated by steps shown in FIGS. 4A to 5B.

Figure 4A:
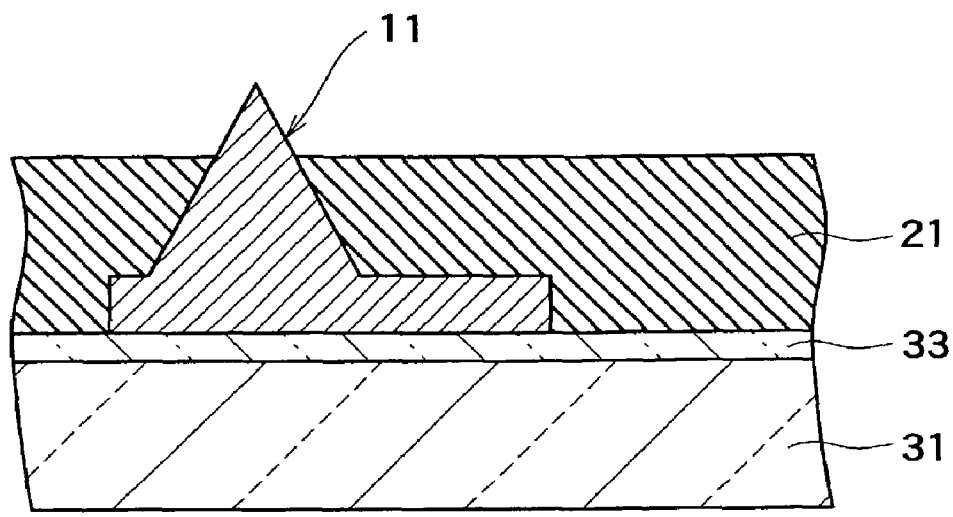
FIGS. 4A and 4B are schematic sectional views showing steps of producing a resin-covered chip used for the display unit according to the first embodiment.
Figure 13A:
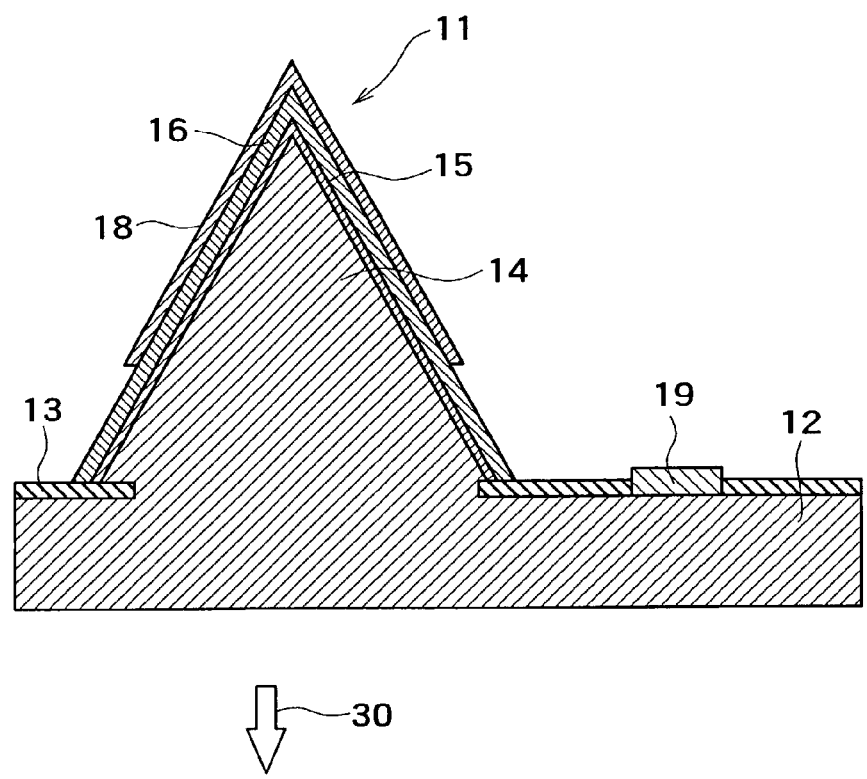
FIGS. 13A and 13B are an enlarged sectional view and a plan view showing a semiconductor light emitting device of the display unit according to the earlier invention.
Figure 13B:
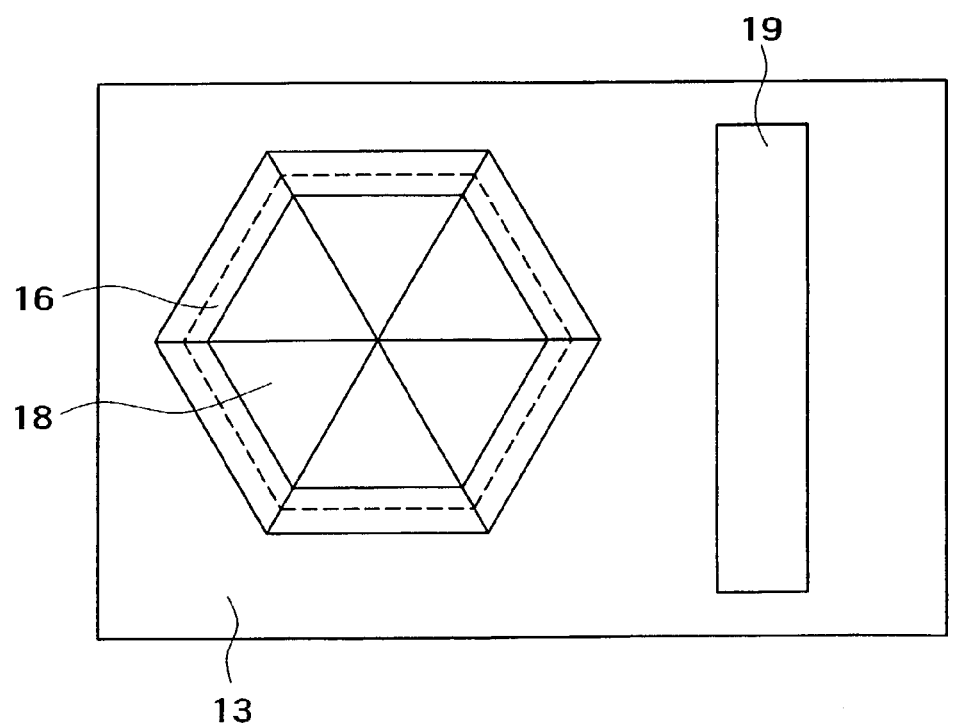

As shown in FIG. 4A, GaN based semiconductor light emitting devices 11, each of which is buried in a first insulating layer 21 made from epoxy region as shown in FIGS. 13A and 13B, are arrayed with a specific pitch on the upper surface of a transparent base body 31 taken as a display panel, and are fixed thereto via a transparent adhesive 33 previously provided on the transparent base body 31.

Figure 4B:
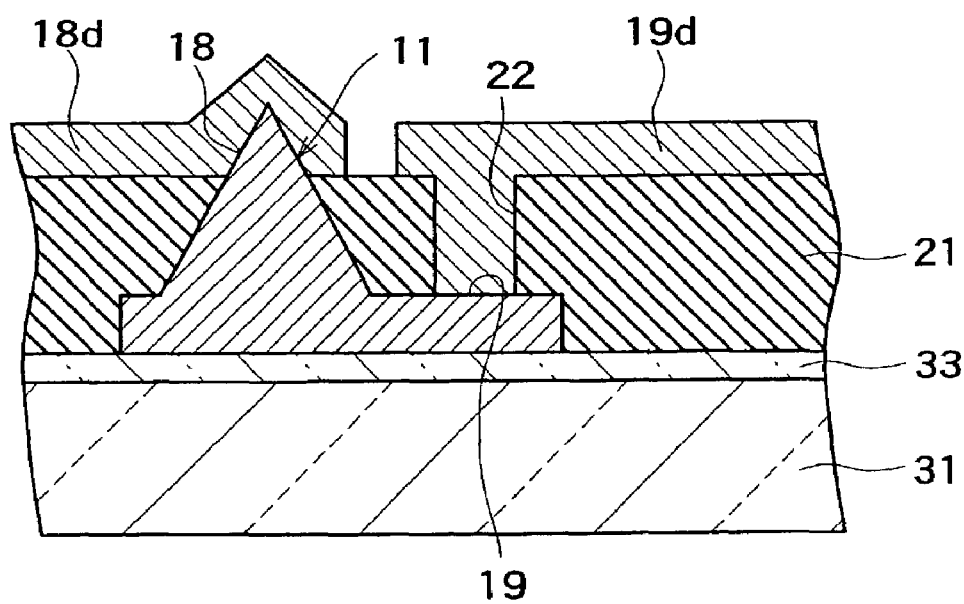

As shown in FIG. 4B, an extraction p-side electrode 18d and an extraction n-side electrode 19d extracted from a p-side electrode 18 and an n-side electrode 19 of each light emitting device 11 are respectively formed on the first insulating layer 21 covering the semiconductor light emitting device 11.

Figure 5A:
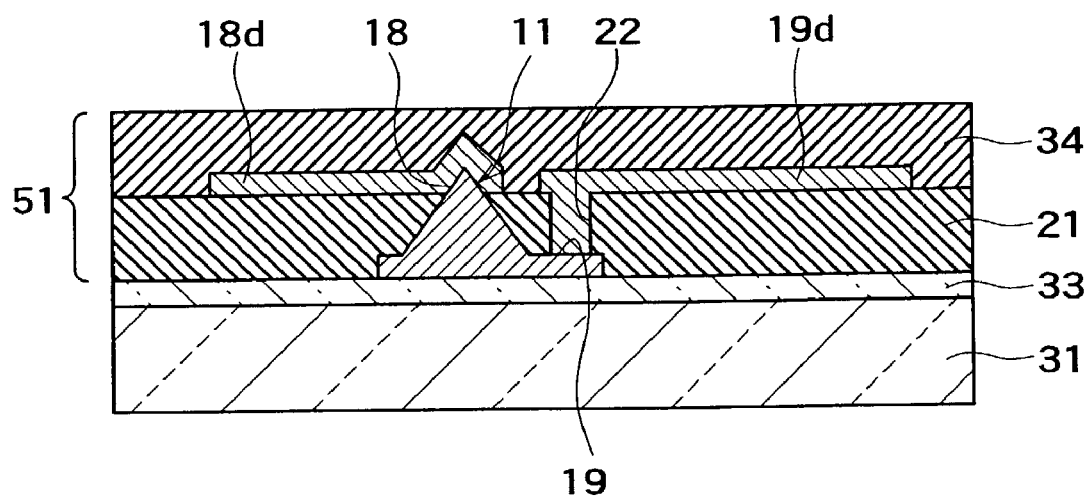
FIGS. 5A and 5B are schematic sectional views showing production steps subsequent to the steps shown in FIGS. 4A and 4B.

As shown in FIG. 5A, an epoxy resin solution is applied over the entire surface of the first insulating layer 21, and is dried and heated to be cured, to form a second insulating layer 34 made from epoxy region on the first insulating layer 21.

Figure 5B:
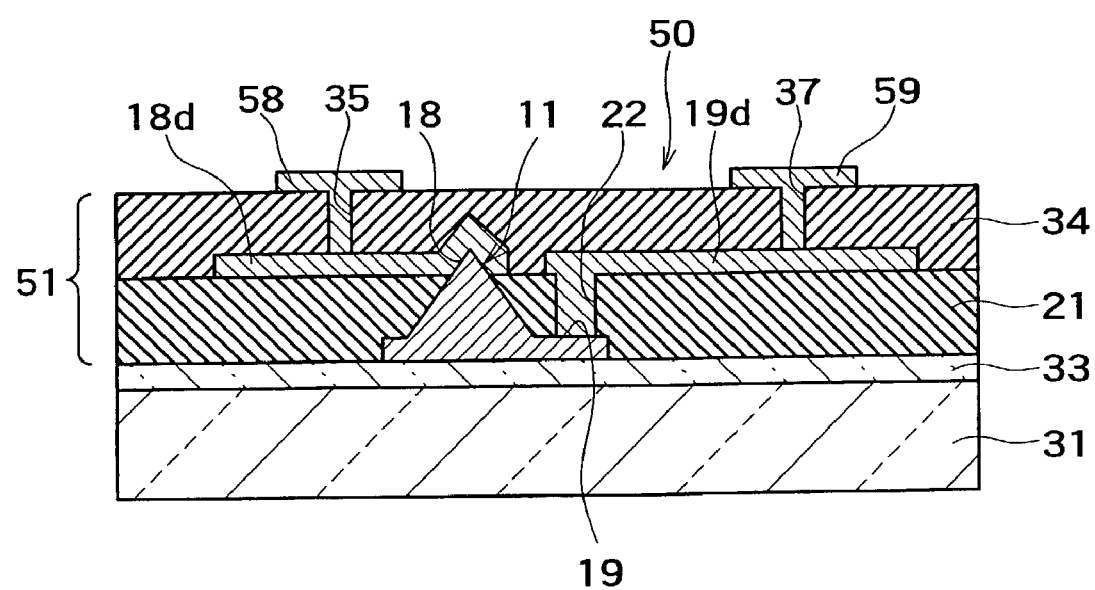

As shown in FIG. 5B, connection holes 35 and 37 are formed in the upper surface of the second insulating layer 34 so as to reach the extraction p-side electrode 18d and the extraction n-side electrode 19d of the semiconductor light emitting device 11, respectively. An aluminum layer is then formed on the overall surface of the second insulating layer 34 so as to bury the connection holes 35 and 37 by a vapor-deposition process or a sputtering process, and is patterned by photolithography, to form an external terminal (pad) 58, part of which buries the connection hole 35, and an external terminal (pad) 59, part of which buries the connection hole 37. As a result, the p-side electrode 18 of the semiconductor light emitting device 11 is lead to the external terminal 58 via the extraction p-side electrode 18d, and the n-side electrode 19 of the semiconductor light emitting device 11 is led to the external terminal 59 via the extraction n-side electrode 19d.

After each LIP 50 is thus fabricated, as shown in FIG. 1, solder bumps 70 and 71 are bonded to the external terminals 58 and 59 respectively, and then the LIP 50 is fixedly mounted face-down to and pads 62 and 64 of a drive transistor 55 fixed on a substrate 51 to fabricate a light emitting unit 82.

Figure 12:
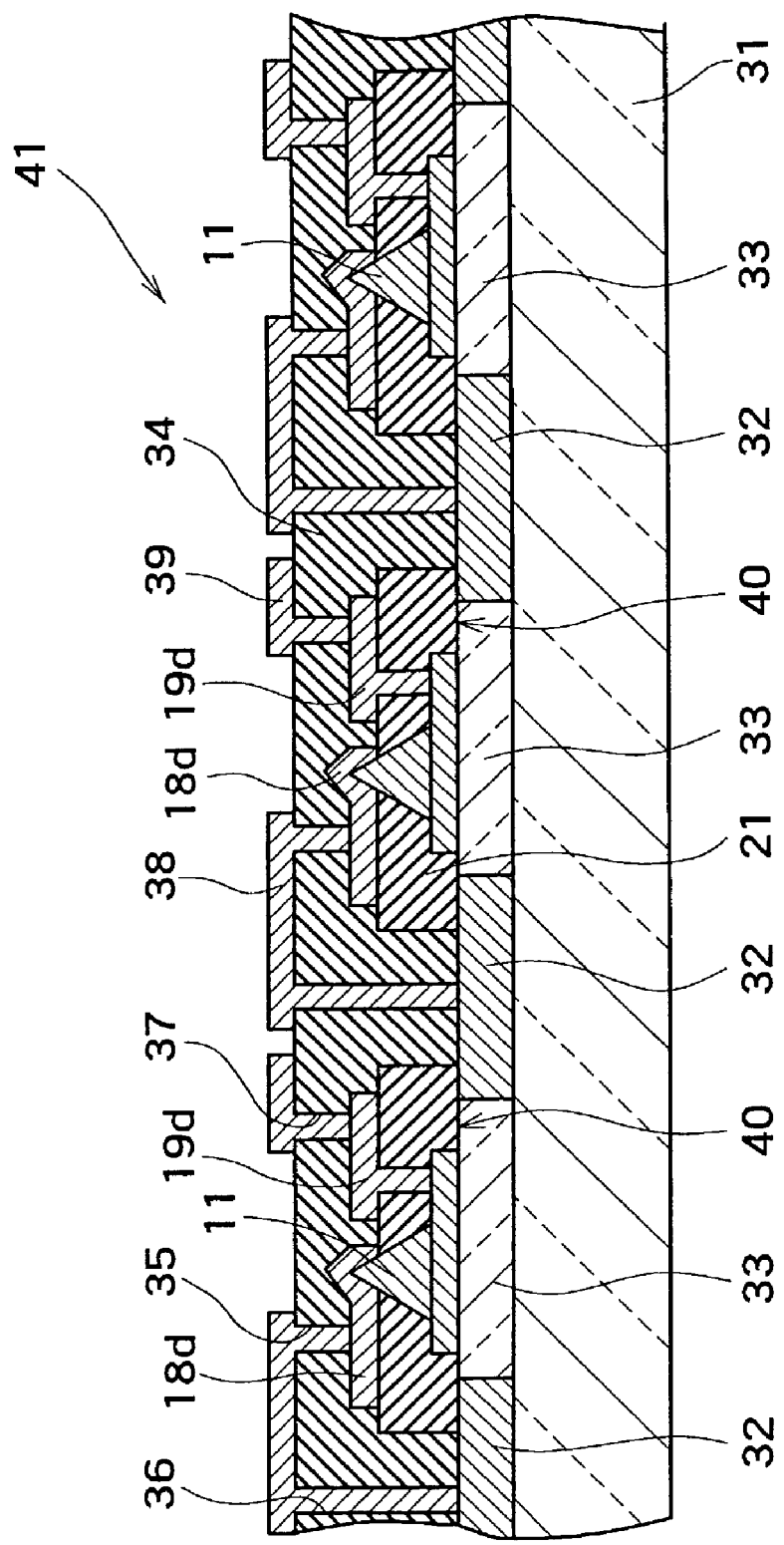
FIG. 12 is a sectional view showing an essential portion of a display unit according to an earlier invention.

It is to be noted that materials, formation methods, shapes, structures, and the like of the semiconductor light emitting device 11, and the insulating layers such as the first insulating layers and the second insulating layer 34, are desirable to be the same as those described with reference to FIGS. 12 and FIGS. 13A and 13B, but may be different therefrom.

According to this embodiment, since the resin-covered chip 50 in which the semiconductor light emitting device 11 is buried is overlapped on the drive transistor 55 and is connected thereto, the resin-covered chip 50 and the drive transistor 55 can be three-dimensionally disposed. This is advantageous in substantially eliminating the occupied area of the drive transistor 55 and correspondingly improving the pixel density, and also keeping a high pixel density even if the size of each chip 50 is enlarged.

As a result, the diameters of the connection holes (via-holes) 35 and 37 can be enlarged, so that the reliability in connection of the extraction electrodes 18d and 19d with the external terminals 58 and 59 via the connection holes 35 and 37, respectively, to improve the fabrication yield. Also, it is possible to facilitate the handling of each chip, for example, at the time of bonding each chip and improve the bonding rate by increasing the apparent area of each chip (device) and, hence, to improve the fabrication yield and also lower the required specification in terms of alignment accuracy of each chip (device).

This embodiment has another advantage that since the semiconductor light emitting device 11 buried in each resin-covered chip 50 is connected to the external terminals 58 and 59 provided on the chip 50 and the drive transistor 55 is connected to the external terminals 58 and 59, it is possible to reduce the occupied area of the light emitting devices 11 per unit area of the display unit, simplify the wiring and significantly lower the costs. Also, since the micro-sized light emitting device 11 is buried in the resin, to form the chip 50 having a large apparent size, it is possible to facilitate the handling of the micro-sized light emitting device 11.

A further advantage of this embodiment is that since the chip 50 is disposed on the upper surface of the drive transistor 55, it can be checked whether or not the light emitting device 11 desirably emits light before the device 11 is filled with the under fill material 72. If it is decided that the chip 50 is defective, the defective chip 50 can be easily repaired such that it is possible to improve the product reliability of the light emitting device 11.

Second Embodiment

A light emitting unit represented by a display unit according to a second embodiment will be described with reference to FIG. 6.

Figure 6:
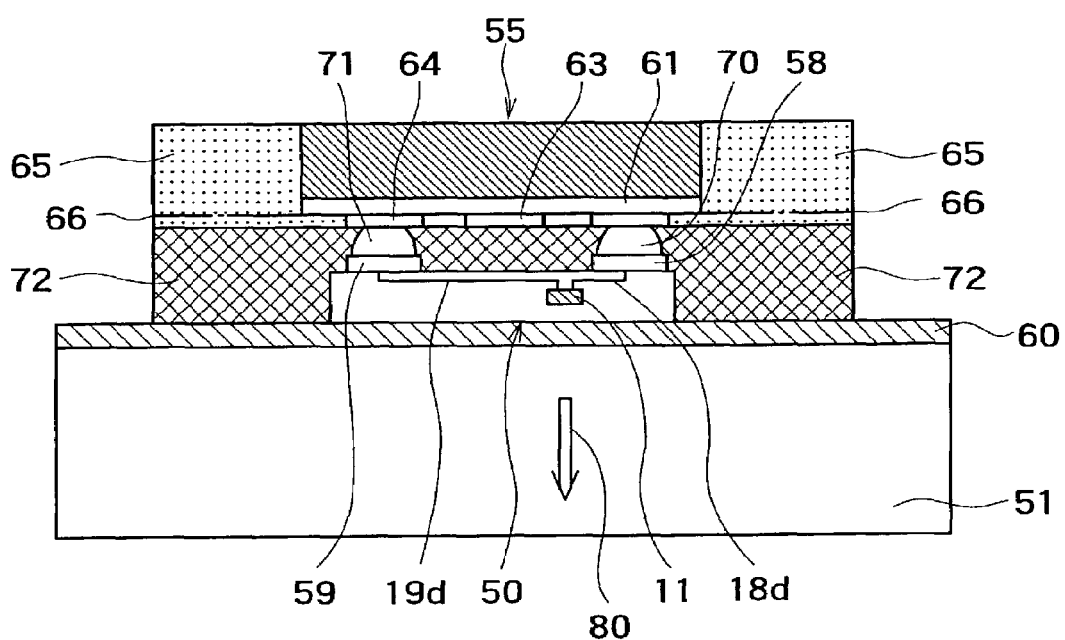
FIG. 6 is a sectional view showing an essential portion of a display unit according to a second embodiment of the present invention.

As shown in FIG. 6, the light emitting unit according to this embodiment has a structure different from that of the light emitting unit according to the first embodiment shown in FIGS. 1 and 2 in that the positional relationship between a resin-covered chip 50 in which a semiconductor light emitting device 11 is buried and a drive transistor 55 for driving the chip 50 according to this embodiment is vertically reversed to the positional relationship therebetween according to the first embodiment. Concretely, according to this embodiment, the chip 50 is disposed on the lower side (transparent substrate 51 side), and the drive transistor 55 is disposed on the upper side.

With this configuration, light rays 80 emitted from the semiconductor light emitting device 11 can be emerged through the transparent substrate 51, so that the plane of the substrate 51 can be taken as an image display plane.

The other configurations of this embodiment are the same as those of the first embodiment and, therefore, the same effect as that obtained by the first embodiment can be obtained. It is to be noted that, according to this embodiment, a bonding material 60 is used for fixing the chip 50, and an insulating layer 72 is used so as to serve as the under fill material on which a wiring layer 66 is formed.

Third Embodiment

Figure 7:
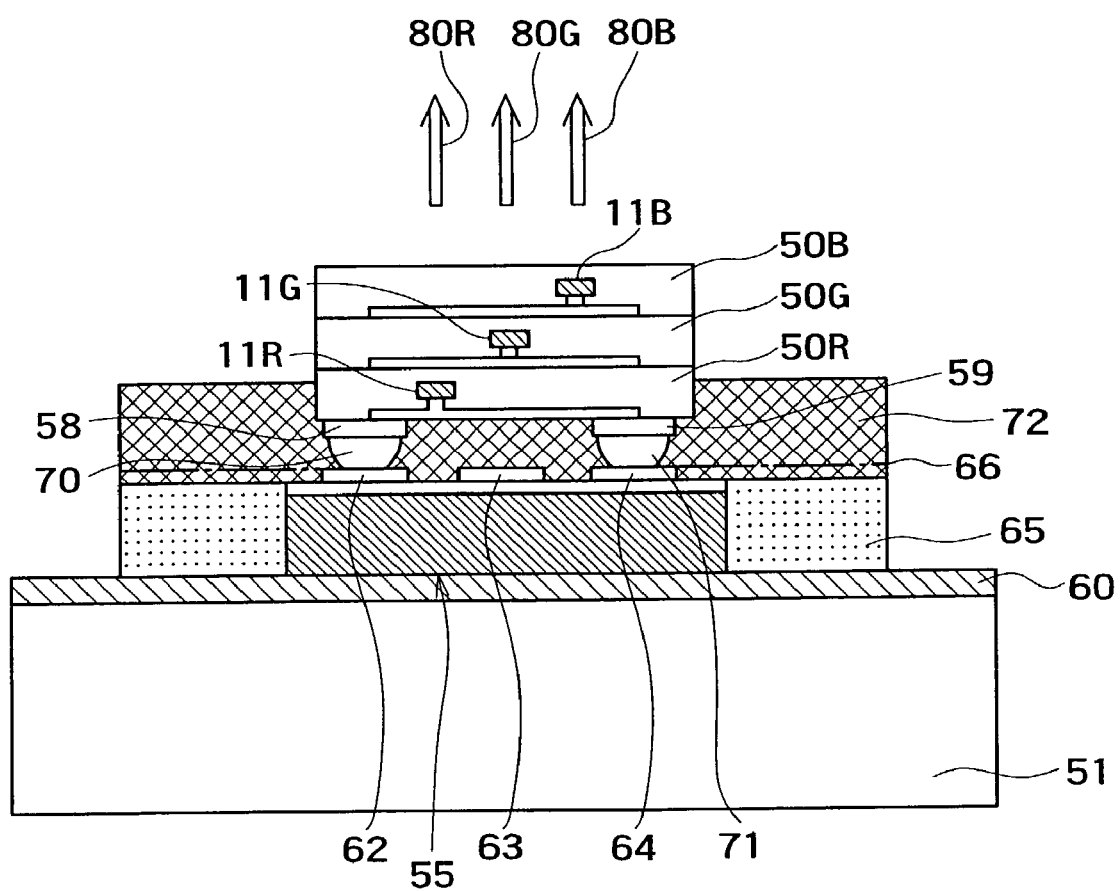
FIG. 7 is a sectional view showing an essential portion of a display unit according to a third embodiment of the present invention.

A light emitting unit represented by a display unit according to a third embodiment will be described with reference to FIG. 7.

The light emitting unit according to this embodiment has a structure different from that of the light emitting unit according to the first embodiment shown in FIGS. 1 and 2 in that resin-covered chips 50R, 50G, and 50B for emission of light of red, green, and blue, respectively, are not disposed side by side on one plane, but are vertically overlapped to each other above a drive transistor 55 in such a manner that semiconductor light emitting devices 11R, 11G, and 11B buried in the chips 50R, 50G, and 50B, respectively, are offset from each other. It is to be noted that in FIG. 7, the connection between each extraction electrode and the drive transistor 55 is shown only for the device 11R for emission of red light. For each of the devices 11G and 11B for emission of light of green and blue, the connection between each extraction electrode and the drive transistor 55 can be made via through-hole plating of connection holes (not shown) formed in each chip and external terminals provided on the bottom plane of the lowermost chip.

With this configuration, light rays 80R, 80G, and 80B emitted from the semiconductor light emitting devices 11R, 11G, and 11B can be emerged upwardly to obtain a compact full-color image display unit. Another advantage of this embodiment is that since the chips 50R, 50G, and 50B are overlapped to each other at the same position, it is possible to prevent occurrence of a positional deviation among these chips 50R, 50G, and 50B and, hence, to enhance the image quality. The other configurations of this embodiment are the same as those of the first embodiment and, therefore, the same effect as that obtained by the first embodiment can be obtained.

Fourth Embodiment

Figure 8:
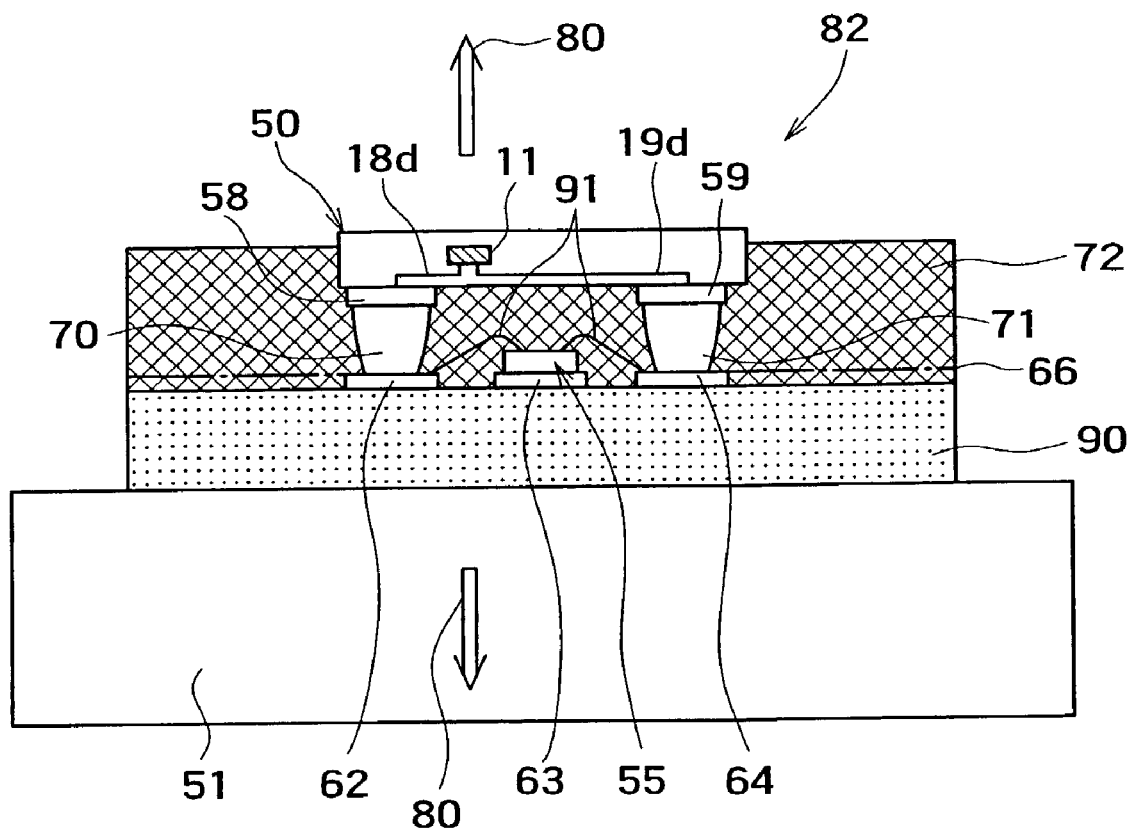
FIG. 8 is a sectional view, taken on line VIII-VIII of FIG. 9, showing an essential portion of a display unit according to a fourth embodiment of the present invention.
Figure 9:
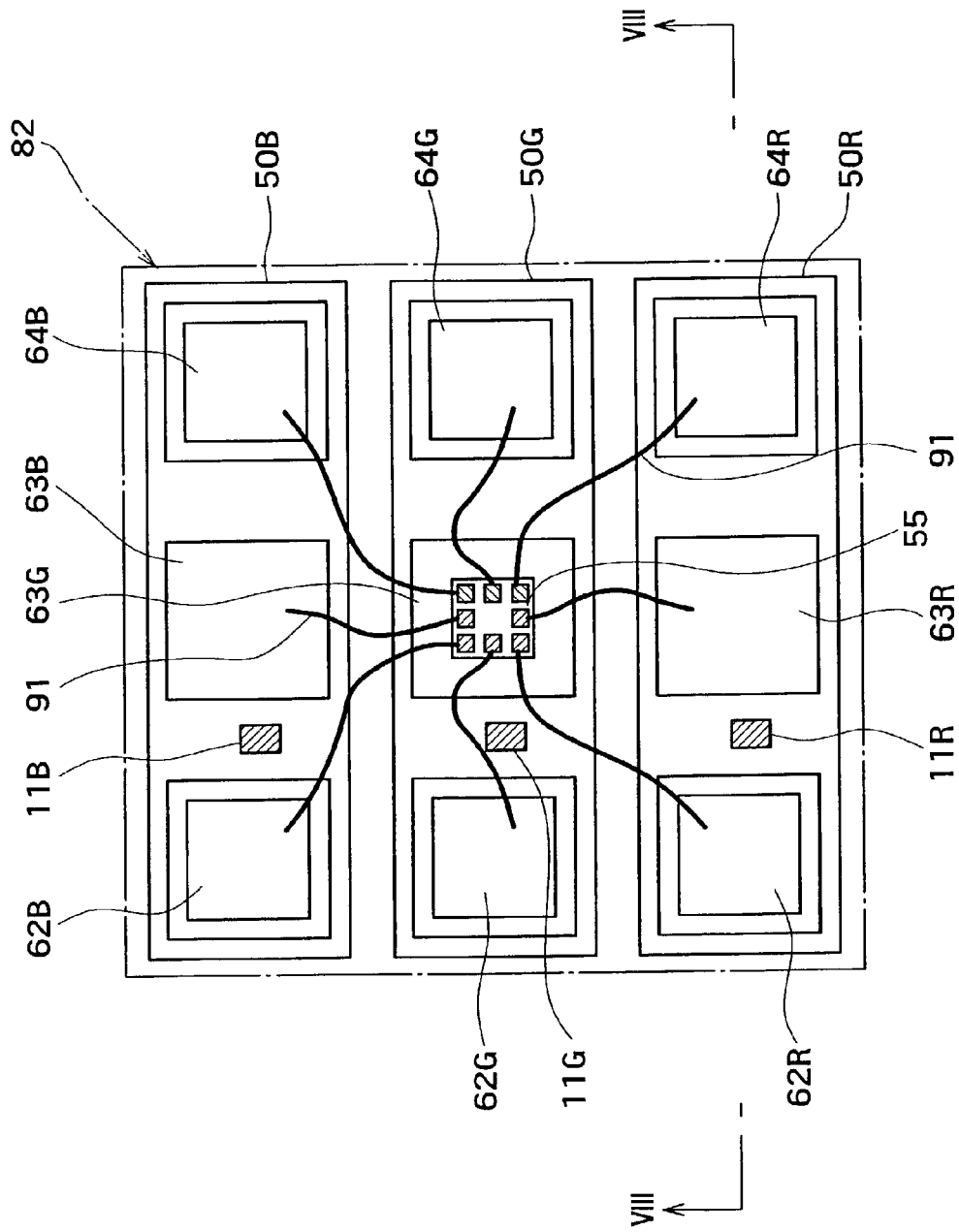
FIG. 9 is a plan view showing an essential portion of the display unit according to the fourth embodiment.
Figure 10:
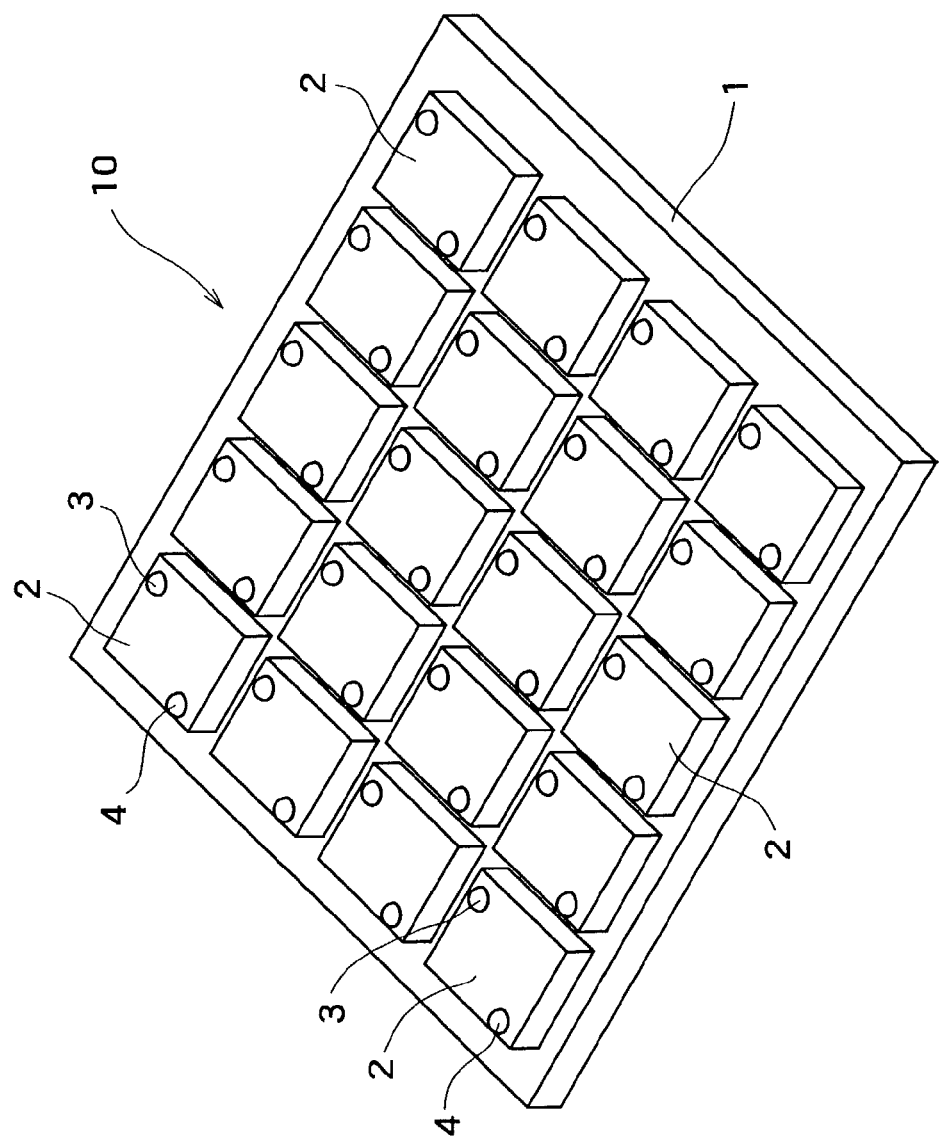
FIG. 10 is a schematic perspective view of a related art display unit.
Figure 11:
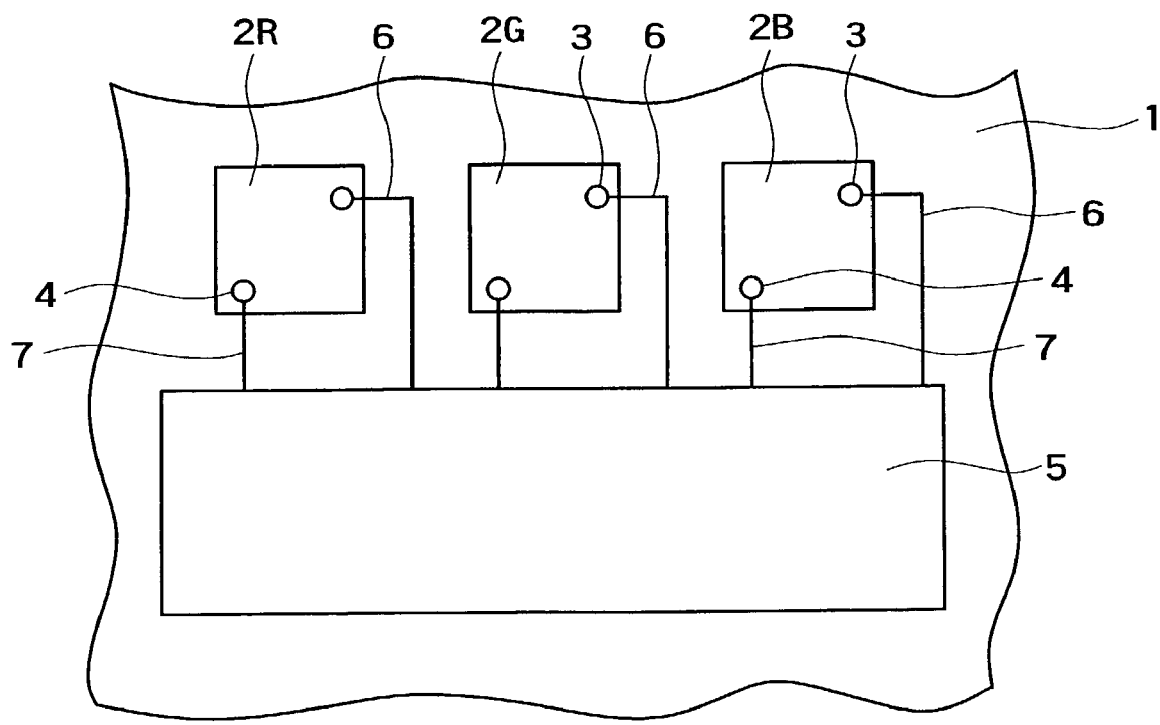
FIG. 11 is a plan view showing an essential portion of the related art display unit.

A light emitting unit represented by a display unit according to a fourth embodiment will be described with reference to FIGS. 8 and 9.

The light emitting unit according to this embodiment has a structure different from that of the light emitting unit according to the first embodiment shown in FIGS. 1 and 2 in that a drive transistor 55 is formed into a size smaller than that of a resin-covered chip 50 in which a semiconductor light emitting device 11 is buried. The small-sized drive transistor 55 common to the three kinds of resin-chips 50 for emitting of light of three colors is bonded to an electrode pad 63 provided on a transparent insulating layer 90 (which is not necessarily provided) provided on a transparent substrate 51 and is connected to electrode pads 62 and 64 on the insulating layer 90 by wire bonding using wires 91, and each of the chips 50 for three colors are provided over the drive transistor 55. It is to be noted that the chips 50 may be formed on the insulating layer 90 and the drive transistor 55 be provided over the chips 50. In FIG. 9, signal lines for connecting chips to each other are not shown for simplicity.

According to this embodiment, the drive transistor 55 having a size smaller than that of each of the chips 50 for the three colors is fixed on the insulating layer 90 at a position within a region, on which one of the chips 50 (the chip 5OG in this embodiment) is thrown, of the insulating layer 90 and is connected to the pads as being common to the chips 50 for the three colors, and the chips 50 are disposed over the drive transistor 55, so that the chips 50 and the drive transistor 55 can be three-dimensionally disposed. As a result, like the first embodiment, it is possible to substantially eliminate the occupied area of the drive transistor 55 and correspondingly improve the pixel density, and also to keep a high pixel density even if the size of each chip 50 is enlarged.

As a result, the diameters of the connection holes (via-holes) 35 and 37 can be enlarged, so that the reliability in connection of the extraction electrodes 18*d* and 19*d* with the external terminals 58 and 59 via the connection holes 35 and 37, respectively, to improve the fabrication yield. Also, it is possible to facilitate the handling of each chip, for example, at the time of bonding each chip and improve the bonding rate by increasing the apparent area of each chip (device) and, hence, to improve the fabrication yield and also lower the required specification in terms of alignment accuracy of each chip (device).

This embodiment has another advantage that since the external terminals 58 and 59 provided on each chip 50 in which the semiconductor light emitting device 11 is buried and the drive transistor 55 are connected to the electrode terminals 62 and 64 provided on the insulating layer 90, it is possible to reduce the occupied area of the light emitting devices 11 per unit area of the display unit, simplify the wiring, and significantly lower the cost. Also, since the drive transistor 55 has a microsize, light emitted from each of the light emitting devices 11 can be emerged not only from the chip 50 side but from the transparent substrate 51 side, with a result that it is possible to provide a double-side imaging display unit having image display planes on both sides, which display unit is desirable in terms of easy tiling.

A further advantage of this embodiment is that since the micro-sized light emitting device 11 is buried in the resin, to form the chip 50 having a large apparent size, it is possible to facilitate the handing of the light emitting device 11. Since the chip 50 is disposed on the upper side, it is easy to repair a defective chip.

In the above-described embodiments, the LIP 50 and the drive transistor 55 are perfectly overlapped to each other. However, the same effect can be obtained even when they may be partially overlapped to each other.

In the fourth embodiment using the micro-sized drive transistor, the drive transistor can be arbitrarily disposed insofar as it is offset from the light emitting devices. Moreover, the chips for the three colors are not necessarily disposed side by side on the same plane but may be stacked to each other in the vertical direction.

Although the light emitting unit of the present invention is configured as that applied to the image display unit in the above embodiments, it is applicable to a light source unit.

Although the present invention has been described with reference to specific embodiments, those of skill in the art will recognize that changes may be made thereto without departing from the spirit and scope of the present invention as set forth in the hereafter appended claims.

The invention claimed is:

1. A light emitting unit, comprising:
    a chip in which a single inorganic light emitting device is embedded within a first insulator material; and
    a single drive control device for controlling driving of the light emitting device;
    wherein an external terminal connected to the light emitting device is provided on the chip, and the drive control device is connected to the external terminal by connections disposed between the drive control device and the light emitting device, wherein the drive control device is at least partially overlapped to the chip, and wherein the drive control device is at least partially surrounded by a second insulator material.

2. A light emitting unit as claimed in claim 1, wherein the drive control device is overlapped face-up or face-down to the chip.

3. A light emitting unit as claimed in claim 1, wherein the drive control device is fixed on a substrate, and the chip is fixedly connected onto the drive control device.

4. A light emitting unit as claimed in claim 1, wherein the chip is fixed on a substrate, and the drive control device is fixedly connected onto the chip.

5. A light emitting unit as claimed in claim 4, wherein the substrate has light transmissivity.

6. A light emitting unit as claimed in claim 3, wherein at least a side surface of the drive control device or the chip is covered with an insulating layer, and wiring connected to the drive control device or the chip extends on the insulating layers.

7. A light emitting unit as claimed in claim 4, wherein at least a side surface of the drive control device or the chip is covered with an insulating layer, and wiring connected to the drive control device or the chip extends on the insulating layer.

8. A light emitting unit as claimed in claim 5, wherein at least a side surface of the drive control device or the chip is covered with an insulating layer, and wiring connected to the drive control device or the chip extends on the insulating layer.

9. A light emitting unit as claimed in claim 1, wherein a plurality of chips in which light emitting devices for emission of light of different colors are respectively buried are disposed side by side or stacked to each other in a state being overlapped to the drive control device and are connected to the drive control device.

10. A light emitting unit as claimed in claim 1, wherein the light emitting device is a semiconductor light emitting device that is made from a gallium nitride based semiconductor and is buried in a resin having light transmissivity.

11. A light emitting unit as claimed in claim 1, wherein the light emitting unit is configured as an image display unit or a light source unit.

12. A light emitting unit, comprising:
a chip in which a single inorganic light emitting device is embedded within a first insulator material; and
a single drive control device for controlling driving of the light emitting device, the drive control device being smaller than the chip, wherein the drive control device is at least partially surrounded by a second insulator material;
wherein an external terminal connected to the light emitting device is provided on the chip;
the drive control device is fixed on an insulating layer at a position within a region, on which the chip is grown, of the insulating layer; and
the external terminal of the chip and the drive control device are connected to an electrode terminal provided on the insulating layer between the chip and the drive control device.

13. A light emitting unit as claimed in claim 12, wherein the light emitting device and the drive control device are located at positions not overlapped to each other.

14. A light emitting unit as claimed in claim 12, wherein the drive control device is fixed to the insulating layer at a position different from a position at which the external terminal of the chip is connected to the electrode terminal, and the drive control device is connected to the electrode terminal via a conductor.

15. A light emitting unit as claimed in claim 12, wherein the drive control device is fixed to the insulating layer, and the chip is disposed above the drive control device.

16. A light emitting unit as claimed in claim 12, wherein the chip is fixed to the insulating layer, and the drive control device is disposed above the chip.

17. A light emitting unit as claimed in claim 15, wherein the insulating layer has light transmissivity.

18. A light emitting unit as claimed in claim 16, wherein the insulating layer has light transmissivity.

19. A light emitting unit as claimed in claim 15, wherein at least a side surface of the drive control device or the chip is covered with an insulating layer, and wiring connected to the drive control device or the chip extends on the insulating layer.

20. A light emitting unit as claimed in claim 16, wherein at least a side surface of the drive control device or the chip is covered with an insulating layer, and wiring connected to the drive control device or the chip extends on the insulating layer.

21. A light emitting unit as claimed in claim 17, wherein at least a side surface of the drive control device or the chip is covered with an insulating layer, and wiring connected to the drive control device or the chip extends on the insulating layer.

22. A light emitting unit as claimed in claim 12, wherein a plurality of chips in which light emitting devices for emission of light of different colors are respectively buried are stacked to each other in a state being overlapped to the drive control device and are connected to the drive control device.

23. A light emitting unit as claimed in claim 12, wherein the light emitting device is a semiconductor light emitting device that is made from a gallium nitride based semiconductor and is buried in a resin having light transmissivity.

24. A light emitting unit as claimed in claim 12, wherein the light emitting unit is configured as an image display unit or a light source unit.

25. A light emitting unit, comprising:
a chip in which a single light emitting device is embedded within a first insulator material, wherein said light emitting device includes an n type electrode and a p type electrode; and
a single drive control device for controlling driving of the light emitting device;
wherein an external terminal connected to the n type electrode or the p type electrode of the light emitting device is provided on the chip, and the drive control device is connected to the external terminal by connections disposed between the drive control device and the light emitting device, wherein the drive control device is at least partially overlapped to the chip, and wherein the drive control device is at least partially surrounded by a second insulator material.

26. A light emitting unit as claimed in claim 25, wherein the light emitting device is an inorganic light emitting device.

27. A light emitting unit as claimed in claim 25, wherein the light emitting device is a semiconductor light emitting device that is made from a gallium nitride based semiconductor and is buried in a resin having light transmissivity.

28. A light emitting unit, comprising:
a chip in which a single light emitting device is embedded within a first insulator material, wherein said light emitting device includes an n-side electrode and a p-side electrode; and
a single drive control device for controlling driving of the light emitting device, the drive control device being smaller than the chip, wherein the drive control device is at least partially surrounded by a second insulator material;
wherein an external terminal connected to the n type electrode or the p type electrode of the light emitting device is provided on the chip;
the drive control device is fixed on an insulating layer at a position within a region, on which the chip is grown, of the insulating layer; and the external terminal of the chip and the drive control device are connected to an electrode terminal provided on the insulating layer between the chip and the drive control device.

29. A light emitting unit as claimed in claim 28, wherein the light emitting device is an inorganic light emitting device.

30. A light emitting unit as claimed in claim 28, wherein the light emitting device is a semiconductor light emitting device that is made from a gallium nitride based semiconductor and is buried in a resin having light transmissivity.

31. A light emitting unit as claimed in claim 28, wherein the drive control device is surrounded on at least four sides of said drive control device by the second insulator material.

* * * * *